US010267835B2

(12) United States Patent
Tajima (10) Patent No.: US 10,267,835 B2
(45) Date of Patent: Apr. 23, 2019

(54) CHARGE CALCULATION APPARATUS, CHARGE CALCULATION SYSTEM, AND CHARGE CALCULATION METHOD (75) Inventor: Shigeru Tajima, Kanagawa (JP)

(73) Assignee: SONY CORPORATION, Tokyo (JP)

(*) Notice: Subject to any disclaimer, the term of this patent is extended or adjusted under 35 U.S.C. 154(b) by 157 days.

(21) Appl. No.: 12/971,003

(22) Filed: Dec. 17, 2010

(65) Prior Publication Data
US 2011/0161143 A1 Jun. 30, 2011

(30) Foreign Application Priority Data
Dec. 24, 2009 (JP) ................................ 2009-293022

(51) Int. Cl.
G06F 19/00 (2018.01)
H02J 7/00 (2006.01)
(Continued)

(52) U.S. Cl.
CPC .......... G01R 22/10 (2013.01); B60L 11/1846 (2013.01); G06Q 30/0207 (2013.01); G06Q 50/06 (2013.01); H02J 5/00 (2013.01); H02J 7/02 (2013.01); B60L 2200/26 (2013.01); Y02T 10/7005 (2013.01); Y02T 10/7072 (2013.01); Y02T 90/121 (2013.01); Y02T 90/128 (2013.01); Y02T 90/14 (2013.01); Y02T 90/163 (2013.01);
(Continued)

(58) Field of Classification Search
USPC ................................ 705/28, 14.25; 320/109
See application file for complete search history.

(56) References Cited

U.S. PATENT DOCUMENTS 7,497,285 B1 * 3/2009 Radev ...................... B60K 6/26
180/65.225
7,956,570 B2 * 6/2011 Lowenthal .......... B60L 11/1816
320/104
(Continued)

FOREIGN PATENT DOCUMENTS

CN 101400542 A 4/2009
JP 2001-306191 11/2001
(Continued)

OTHER PUBLICATIONS

Japanese Office Action dated Sep. 17, 2013 in Patent Application No. 2009-293022.
(Continued)

Primary Examiner — Talia F Crawley
(74) Attorney, Agent, or Firm — Xsensus, LLP (57) ABSTRACT A charge calculation apparatus, system and method allow for a controller to administer an electric power charging operation to one or more client devices, such as an electric vehicle. The vehicle provides its ID to the controller, which in turn calculates a tax according to the vehicle making the request, and other factors such as taxing jurisdiction, amount of electricity used, timing, etc. By controlling the charging operation in this way, the taxing authorities are able to collect tax revenue for use in maintaining roads from the users of those roads by monitoring which vehicles are using electricity to operate the vehicles on the roads. By keeping track of the vehicle's movement within different tax jurisdictions, the tax may be apportioned amongst the different taxing authorities.

23 Claims, 4 Drawing Sheets (51) Int. Cl.
  *G07F 19/00* (2006.01)
  *G01R 22/10* (2006.01)
  *H02J 5/00* (2016.01)
  *G06Q 30/02* (2012.01)
  *G06Q 50/06* (2012.01)
  *H02J 7/02* (2016.01)
  *B60L 11/18* (2006.01)

(52) U.S. Cl.
  CPC .............. *Y02T 90/169* (2013.01); *Y04S 10/54* (2013.01); *Y04S 30/14* (2013.01)

(56) References Cited

U.S. PATENT DOCUMENTS

| | | | | |
|---|---|---|---|---|
| 7,991,665 | B2* | 8/2011 | Hafner | B60L 3/0046 705/14.11 |
| 8,429,435 | B1* | 4/2013 | Clayton | H04L 12/10 700/19 |
| 2003/0112242 | A1* | 6/2003 | Vitale | B60Q 1/56 345/440 |
| 2004/0094622 | A1* | 5/2004 | Vismara | G07B 15/00 235/384 |
| 2007/0126395 | A1* | 6/2007 | Suchar | B60L 1/003 320/109 |
| 2007/0150139 | A1* | 6/2007 | Hardy | G01C 22/02 701/521 |
| 2009/0021213 | A1* | 1/2009 | Johnson | B60L 11/005 320/109 |
| 2009/0174365 | A1* | 7/2009 | Lowenthal | B60L 11/1816 320/109 |
| 2009/0177580 | A1* | 7/2009 | Lowenthal | B60L 11/1824 705/39 |
| 2009/0259603 | A1* | 10/2009 | Housh | B60L 11/1818 705/412 |
| 2009/0313103 | A1* | 12/2009 | Ambrosio | B60L 8/00 705/14.25 |
| 2009/0313104 | A1* | 12/2009 | Hafner | B60L 3/0046 705/14.25 |
| 2010/0179893 | A1* | 7/2010 | Burke | G06Q 30/04 705/31 |
| 2010/0191674 | A1* | 7/2010 | Condon | G06Q 10/10 705/413 |
| 2010/0262566 | A1* | 10/2010 | Yamamoto | B60L 3/0046 705/412 |
| 2011/0029173 | A1* | 2/2011 | Hyde | G06Q 30/02 701/22 |
| 2011/0115425 | A1* | 5/2011 | Olsson | B60L 3/0046 320/101 |
| 2011/0140835 | A1* | 6/2011 | Ishibashi | B60L 11/1824 340/5.2 |
| 2012/0105003 | A1* | 5/2012 | Laughner | B60L 11/1816 320/109 |

FOREIGN PATENT DOCUMENTS

| | | |
|---|---|---|
| JP | 2002-230233 A | 8/2002 |
| JP | 2007-228695 | 9/2007 |
| JP | 2008-65635 A | 3/2008 |
| JP | 2008-123051 | 5/2008 |
| JP | 2009-070083 A | 4/2009 |
| JP | 2009-129384 A | 6/2009 |
| JP | 2011-509648 A | 3/2011 |
| WO | WO 2009/075313 A1 | 6/2009 |
| WO | WO 2009/089249 A1 | 7/2009 |

OTHER PUBLICATIONS

Office Action dated Apr. 15, 2014 in Japanese Patent Application No. 2009-293022 (with English language translation).
"Many enterprises compete for hegemony aiming at acquisition of American market", Nikkei Electronics, No. 1015, Oct. 19, 2009, pp. 40-47 and Cover Pages.
Office Action dated Sep. 24, 2014 in Japanese Patent Application No. 2009-293022 (with English language translation).
Japanese Office Action dated Jun. 9, 2015 in Patent Application No. 2014-13644 (with English Translation).
Office Action dated Feb. 28, 2015, in Chinese Patent Application No. 201010591658.6 (with English-language Translation).
Combined Office Action and Search Report dated Sep. 2, 2016 in Chinese Patent Application No. 201010591658.6 with English translation.
Office Action dated Aug. 15, 2017 in Japanese Patent Application No. 2016-011559 (with English-language Translation).
Office Action dated Jan. 17, 2017 in Japanese Patent Application No. 2016-011559 (with English-language Translation).

* cited by examiner

CHARGE CALCULATION APPARATUS, CHARGE CALCULATION SYSTEM, AND CHARGE CALCULATION METHOD

BACKGROUND

Field of the Invention

The present invention relates to a charge calculation apparatus, a charge calculation system, and a charge calculation method.

Description of the Related Art

Many electronic devices such as personal computers and a game machines use an AC adaptor, which inputs an alternating-current (AC) power from a commercial power supply and outputs electric power matching the device, for the purpose of the operation of the device and the charge of the battery. Although the electronic device is usually operated by a direct current (DC), the voltage and current requirements are different in each device. Thus, the AC adaptor that outputs electric power matching particular devices is also different for each device. Accordingly, even if AC adaptors have similar shapes, they are not necessarily compatible with each other, and so there is an issue that the number of AC adaptors increases with increasing numbers of devices.

In order to solve the above issue, there has been proposed a power bus system in which a power supply block supplying electric power to devices such as a battery and an AC adaptor and a power consumption block receiving electric power from the power supply block are connected to a common DC bus line (for example, Patent Literatures 1 and 2). In this power bus system, a DC current flows through a bus line. Further, in the power bus system, each block itself is described as an object, and the objects of the respective blocks mutually transmit and receive information (state data) through a bus line. The object of each block generates the information (state data) based on a request from the object of another block and transmits the information as reply data. The object of the block having received the reply data can control electric power supply and consumption based on the contents of the received reply data.

The above power bus system is operated basically independently from an existing grid. Even if there is no existing grid, the power bus system can generate electric power and control power transmission and distribution. When the power bus system is installed at every home at most, the concepts of electric power charge and charging for the amount of used electric power are not required. Even when the existing grid is connected as an input of electric power of the power bus system, an existing watt-hour meter, a smart meter, and the like are provided at the entrance of each home and office. Therefore, in the power bus system, it is unnecessary to consider charging.

However, when the power bus systems installed at each home are connected to each other to be networked, even if the power bus system is operated independently from the existing grid, it is easily considered that the concept of charging for electric power is required. However, the charging system is sort of local, and the charging information can be regarded as a part of information related to power transmission and distribution, such as power specification information (in Japanese Patent Application Laid-Open No. 2008-123051, for example).

Meanwhile, in the future, it is considered that an electric vehicle will be widely used out of consideration for the environment. However, with the spread of electric vehicles, the present inventors recognized that taxing electric power consumed in electric vehicles, as with the existing gasoline tax, may become a reality.

Namely, in current vehicles powered by internal combustion engines, fuel such as gasoline is directly taxed, and the tax is used as funding sources for transportation infrastructure maintenance and improvements. In this same vein, the taxing of electricity for electrical vehicle use may be employed to fund future road-related costs. Thus, it might become a reality to impose a separate tax on electric power for charging electric vehicles separate from a tax imposed on other electric power consumption. This is realized by using the currently proposed smart grid. When an ID of an object which uses electric power is determined to represent an electric vehicle, the electricity charge of the used electric power may be a charge including a tax and other electric power charge (corresponding to the vehicle fuel).

SUMMARY

However, when electric power generated by a local power generation source, such as a personal wind turbine or solar panel, is used for fueling an electric vehicle, it is difficult to impose a tax equivalent to the fuel tax, since the source of the electricity may have been privately produced. Namely, the power source for electric vehicles is not necessarily limited to the power source from the existing grid. The power supply may be a local organic source, that does not interact with the existing power grid.

For example, as proposed by Japanese Patent Application Laid-Open No. 2008-123051 and the like, when the electric power generated in the power bus system based on natural electric power is used for the electric power supply of the electric vehicle, electric power free of tax is used in the electric vehicle. Even if the power bus system or the like utilizing natural energy is allowed to have the function (that is, tax-free charging of the electric vehicle) as an incentive, when the electric vehicle is widely used, fairness of tax burdens between the electric vehicle and other vehicles powered by an internal combustion engine will become an issue.

Namely, in any system, it is assumed that the power supply system is required to have a structure of determining whether a charged object is an object operated by electricity such as an electric vehicle and an electric motorcycle and taxing the object.

In light of the foregoing, it is desirable to provide a novel and improved charge calculation apparatus, charge calculation system, and charge calculation method which can calculate a charge corresponding to an amount of charge in accordance with the charged object.

In one embodiment an electric charging controller includes an interface and a processor. The interface is configured to receive a request for charging from an external device. The processor is configured to calculate an amount of tax to be applied for an amount of electricity used in a charging the external device.

In another embodiment a power server is provided that includes an external interface, a bus interface, and an processor. The external interface is configured to receive electric power from an external source. The bus interface connects to a power bus and in response to a request, delivers power to a client device via the power bus. The processor detects an ID of the client and deliver the power to the client device in a format compatible with the client device.

In another embodiment, a method is provided for determining a tax on a charging of an electric device. The method includes receiving data at a controller requesting an electric charge for an external device. Also a processor is used to calculate an amount of tax for an amount of electricity used to charge the external device.

The present invention as described above can provide a novel and improved charge calculation apparatus, charge calculation system, and charge calculation method which can calculate a charge corresponding to an amount of charge in accordance with the charged object.

DETAILED DESCRIPTION OF THE EMBODIMENT

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

Descriptions are performed in the following order:
<1. Embodiment of the present invention>
[1-1. Constitution of charge calculation system]
[1-2. Operation of charge calculation system]
[1-3. Constitution of controller]
<2. Conclusion>
<1. Embodiment of the Present Invention>
[1-1. Constitution of Charge Calculation System]

Figure 1:
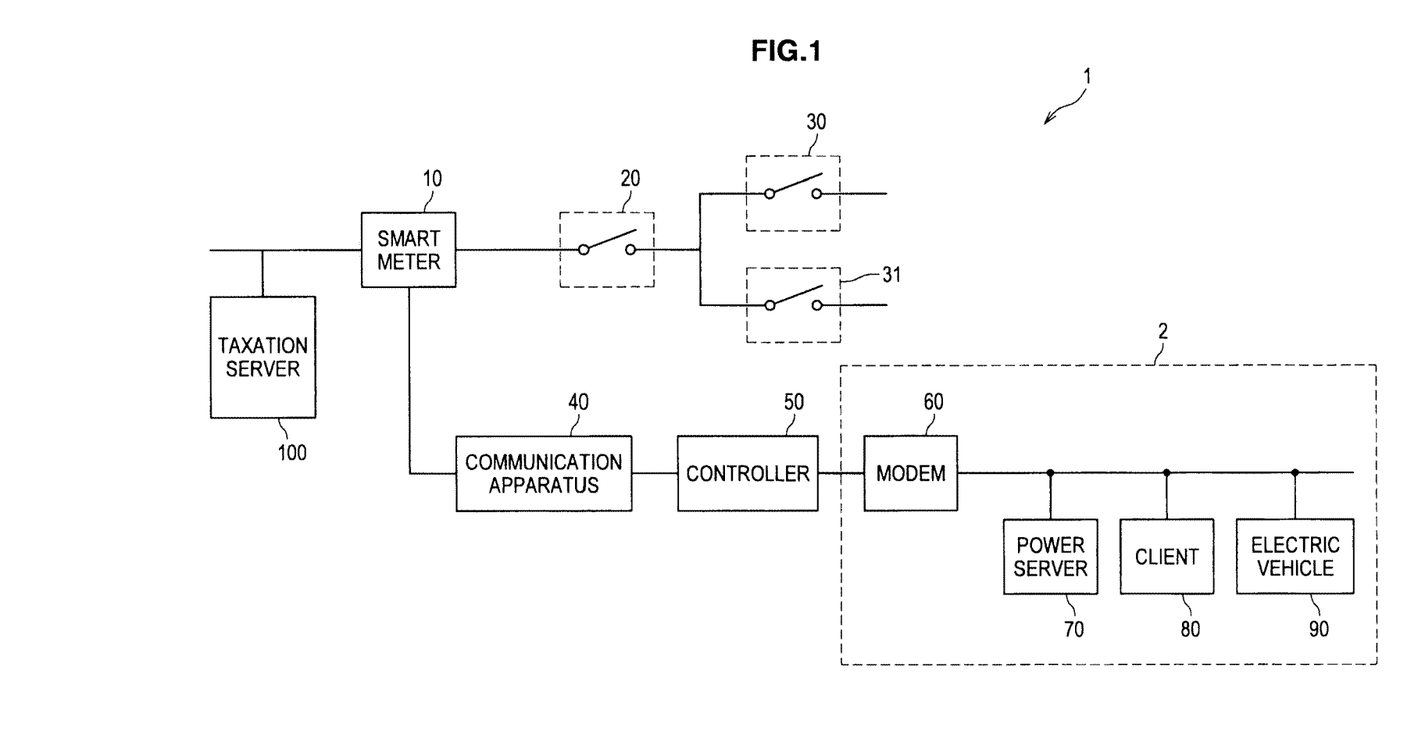
FIG. 1 is an explanatory view showing a constitution of a charge calculation system according to an embodiment of the present invention.

First, a constitution of a charge calculation system according to an embodiment of the present invention will be described. FIG. 1 is an explanatory view showing the constitution of the charge calculation system according to the embodiment of the present invention. Hereinafter, the constitution of the charge calculation system according to the embodiment of the present invention will be described using FIG. 1.

As shown in FIG. 1, a charge calculation system 1 according to an embodiment of the present invention is configured to include a smart meter 10, a main breaker 20, sub breakers 30 and 31, a communication apparatus 40, a controller 50, a modem 60, a power server 70, a client 80, an electric vehicle 90, and a taxation server 100. The modem 60, the power server 70, the client 80, and the electric vehicle 90 shown in FIG. 1 constitute a power bus system 2.

The smart meter 10 converts the amount of electric power supplied from an existing grid and consumed at home and the amount of electric power generated by the power server 70 into data in real time. The smart meter 10 has an external communication function and provides the information of the data of the electric power amount to other servers and electric companies by wired or wireless communication. The main breaker 20 and the sub breakers 30 and 31 control the supply of electric power from the existing grid to a domestic existing distribution system. In a non-limiting example, one of the sub breakers 30 and 31 control a main connection to a public server utility (e.g., the public electric power company) and the other provides access to one or more domestically produced power sources, such as from a wind turbine, solar panel(s) with or without an electrical charged storage device, hydro-based electric power source, or even a fossil fuel based power source (generator), etc. Thus, the main breaker 20 controls electrical connection to with public or private electrical power sources.

The communication apparatus 40 is connected to the external communication function of the smart meter 10. The smart meter 10 can provide the information of the data of the electric power amount to other servers and electric companies through the communication apparatus 40. The communication apparatus 40 and the smart meter 10 may be connected to each other using a wired or wireless LAN, USB, RS-232C, other existing interface, or an exclusive interface for smart meters.

The controller 50 performs a communication control, via a communications interface, between the smart meter 10 and the communication apparatus 40 and a communication control of the power bus system 2. The controller 50 includes a microprocessor for performing those controls, for example, and those communication controls are performed by the microprocessor. The modem 60 is a modem corresponding to the power bus system 2. The modem 60 is used for transmitting electric power and frequency-divided information as disclosed in, for example, Japanese Patent Application Laid-Open No. 2008-123051. The modem may be viewed as a digital communication interface that allows for the free exchange of data associated with charging of the electric vehicle 90 or other devices.

The power server 70 supplies electric power to devices connected to the power bus system 2 and has a function of supplying DC power generated by a solar battery, for example, to the client 80 or the electric vehicle 90. Likewise, the power server 70 obtains access to power from the public and private electric power sources that connect to the main breaker 20. The client 80 receives the electric power supplied from the power server 70 to be operated. In this example, in terms of electric power, the power bus system 2 can transmit and receive electric power independently from the existing grid; however, on the other hand, by virtue of the interposition of the controller 50, the power bus system 2 can communicate information with the smart grid constructed on the existing grid.

The electric vehicle 90 is a vehicle which can travel with electric power charged as a power source in a storage battery and is configured such that it can be charged by electric power supplied from the power server 70 and electric power supplied on the existing grid. The electric vehicle 90 (or even the client 80) contain tamper proof electronic memories that include a unique ID of the particular electric vehicle, as well as other associated data. This associated data may include a variety of information useful in calculating taxes for electrical energy used in powering the vehicle. For example, the associated data may in include (1) local and state registration information, indicating where the vehicle is registered, (2) information regarding vehicle make/model and/or related vehicle and battery characteristic information that allow for the provisioning of tax credits associated with using fuel-efficient vehicles and/or efficient electrical storage devices, (3) credits for previous replenishment charges using green power sources such as private renewable power sources, (4) information regarding how the vehicle is driven such as speed, and acceleration, (5) charging times, such as slow charge in off-peak hours vs. quick charging during peak hours, and (6) types of routes taken to allow for apportionment between states and localities/municipalities (types of taxing jurisdictions) of tax payments based on where the vehicle was driven. The apportionment may be a straight averaging, or may be a division of tax fees according to the taxes levied by the different taxing jurisdictions. The apportionment may relate to a kind of "commuter tax" for taxing at a higher rate those vehicles that traverse state or local boundaries during a daily commute. Also, the tracking of routes would allow for the use of incentives/penalties by local, state or federal governments to encourage travel on some roads, but not others). This tracking data may be stored in the tamperproof memory (or other memory) as provided from a GPS receiver, or navigation system on the electric vehicle.

When the electric vehicle 90 is charged, the taxation server 100 calculates all relevant taxes corresponding to the amount of electric power required for charging of the electric vehicle 90 and taxes the user of the electric vehicle 90. Although a communication method and a protocol on the smart grid are not officially determined at present, at least the taxation server 100 as taxation means to electric power for an electric vehicle can communicate through the communication apparatus 40.

In the present embodiment, the information communicated between the taxation server 100 and the communication apparatus 40 includes the following contents, for example.
(1) The local, state and federal tax rates on electric power for an electric vehicle, and specifically, $/Wh.
(2) Tax payment means such as a bill or a credit card. When tax is paid with bill, the means includes the name and address on the bill. As an optional extra, the information communicated between the taxation server 100 and the communication apparatus 40 may include the following contents.
(3) The tax rate applied when a power source is natural electric power. The tax rate is preferably lower than the tax rate applied when electric power other than natural electric power is used as a power source.
(4) The tax rate depending on a power used time zone. When the power server 70 is used as a power source, charging is performed from other than a smart grid, and therefore, it is not considered to be directly related to power leveling of the smart grid; however, when the power server 70 is used as the power source, the burden on the existing grid is reduced as a result, and thus incentives may exist.
(5) The tax rate on a type of a vehicle. In the current fuel tax, although the tax rate is determined for each type of fuel, the tax rate reflecting the weight of a vehicle and the like is more appropriately used in a road tax and the like, and therefore, the tax rate is considered to be suitable.
(6) Other associated information, such as the items discussed above regarding registration information, driving history, charging times, origin of power, credits for using domestically generated and/or power from renewable power sources.

Meanwhile, when the electric vehicle 90 is charged by the independent power bus system 2, the electricity charge itself and the consumption tax on the electricity charge are free. Namely, when the electric vehicle 90 is charged by the power bus system 2, only particular using method and amount used are taxed, and thus the smart meter 10 is a communication mechanism for collecting taxes on the particular using method and amount used and taxes generated on its use. Thus, the controller 50 performs a basic communication protocol of the smart grid and tax-related processing that is the application data. Of course, if the use is not the charging of the electric vehicle 90, the taxation processing may not be performed with respect to the use.

In order to perform the above functions, the controller 50 has the following functions.
(1) ID storage for storing an ID for use in specifying the electric vehicle 90 as a client. This ID storage may be in the form of a tamperproof memory that will help to avoid improper substitution of false data intended to spoof the tax calculations. If necessary, the ID may be obtained by downloading from an external server (not shown) through the smart meter 10. Of course, one ID may not be provided for one electric bus system, and there are IDs corresponding to the number of the electric vehicles 90 connected as clients. The number of the electric vehicles 90 dynamically changes.
(2) Mechanism for specifying unknown ID returned from the client by inquiring of an external server (not shown) about the ID through the smart meter 10.
(3) The current tax rate storage device. If necessary, this means may be updated from an external server (not shown) through the smart meter 10.
(4) Storage device for the tax payment. For example, when tax is paid with bill, the controller stores the name and address on the bill. When the tax is paid with a credit card, the controller stores the number of the credit card.

The above storage device is preferably nonvolatile. In order to determine the validity, the storage device may have redundancy, and, for example, the device stores a plurality of the same information. Similarly, secure memory is used such that CRC or other checking methods are used to maintain the accuracy of the data, without tampering. Meanwhile, since existing techniques can correspond to the reliability, validity, and the like of the response from the external server, the detailed description will be omitted in the present embodiment.

When the client 80 is an electric vehicle, the protocol and modem corresponding to the electric vehicle are included in the client 80. In the actual electric vehicle, the protocol corresponding to the charging method and the kind of voltage and battery is mounted, and a charge connector is provided with a power line and a communication line. However, the electric vehicle 90 includes an ID showing that the vehicle is an electric vehicle, an ID specifying the type of the vehicle, and a unique ID uniquely specifying the electric vehicle. Those IDs are detected by the controller 50.

Hereinabove, the constitution of the charge calculation system according to an embodiment of the present invention has been described using FIG. 1. Next, the operation of the charge calculation system according to an embodiment of the present invention shown in FIG. 1 will be described.

[1-2. Operation of Charge Calculation System]

Figure 2:
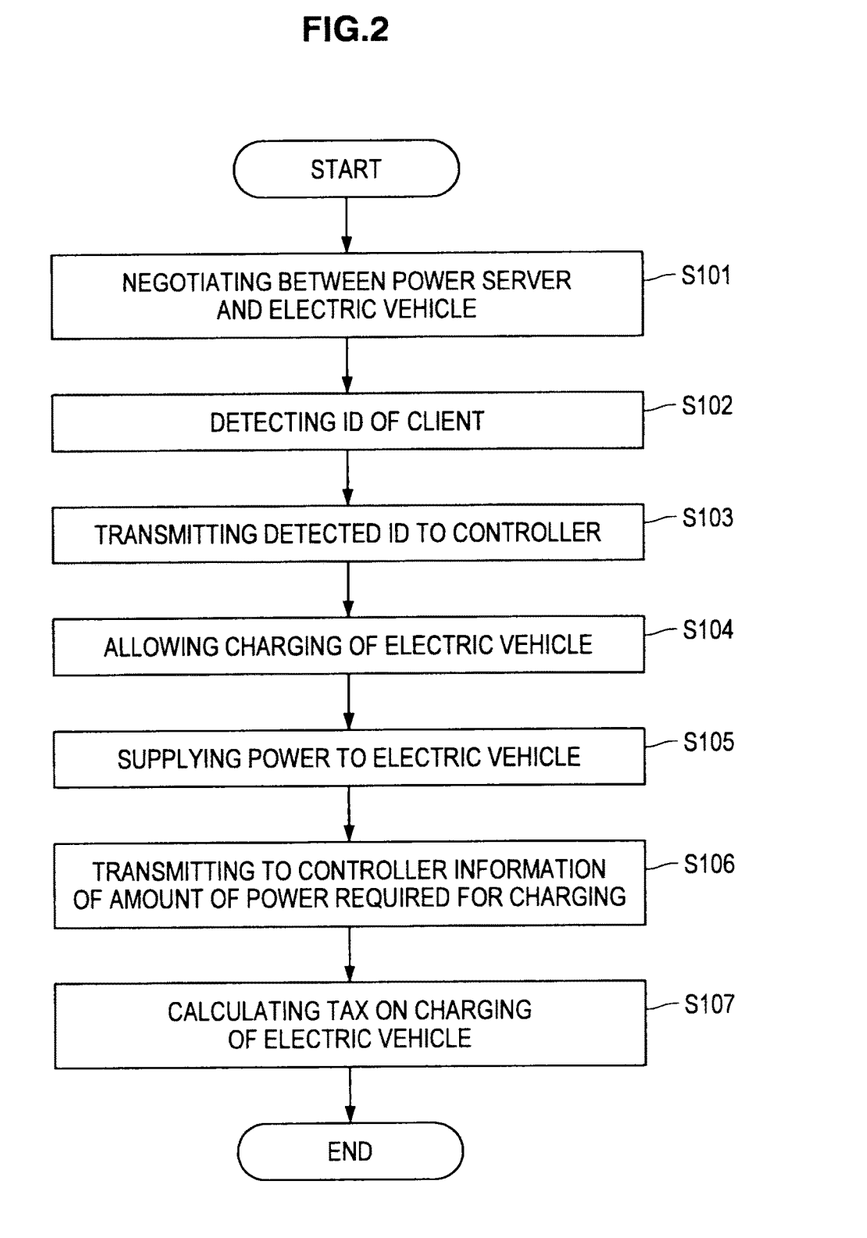
FIG. 2 is a flow chart showing an operation of the charge calculation system according to the embodiment of the present invention.

FIG. 2 is a flow chart showing the operation of the charge calculation system according to an embodiment of the present invention. Hereinafter, the operation of the charge calculation system according to the embodiment of the present invention will be described using FIG. 2.

When the technique proposed in Japanese Patent Application Laid-Open No. 2008-123051 and the like is used, if the electric vehicle 90 which is a kind of client is connected to the power bus system 2, the information (and associated information) of the connected electric vehicle 90 is registered on a power server (in this example, the power server 70) selected as a synchronous server, and the power server 70 supplies electric power to the electric vehicle 90 on request. The electric vehicle 90 determines the amount of electric power to be supplied to the electric vehicle 90 and the power supply time by negotiating with the power server 70 (step S101). The electric vehicle 90 has the ability to calculate the amount of electric power actually supplied to the electric vehicle 90. All the above can be realized by the power bus system proposed in Japanese Patent Application Laid-Open No. 2008-123051, the entire contents of which being incorporated herein by references, and the like.

The power server 70 detects the ID of the electric vehicle 90 connected to the power bus system 2 (step S102). The ID may be unique all over the world (world unique) or may be unique only within a certain range (local unique). This depends on the design of the power bus system 2. However, when the electric vehicle 90 is connected to the power bus system 2, it is designated whether the ID is specified as a world unique ID or an ID that is world-unique as an argument, and it is specified that the client connected to the power bus system 2 is an electric vehicle. Specification of the type of an electric vehicle and specification of a vehicle may be performed as well, especially when tax incentives/penalties apply depending on vehicle type.

When the ID of the electric vehicle 90 is detected by the power server 70 in step S102, the power server 70 transmits the detected ID to the controller 50 (step S103). The controller 50 specifies the actual ID from the ID transmitted from the power server 70. When the ID transmitted from the power server 70 is not recorded on the controller 50, the ID is referred to an external server (not shown) through the smart meter 10. When the reference is completed, the ID is stored in the ID storage means, and, at the same time, the power bus system 2 (that is, a pair of the power server 70 and the electric vehicle 90) is allowed to charge the electric vehicle 90 (step S104).

When the controller 50 allows the power server 70 to charge the electric vehicle 90, the power server 70 supplies electric power to the electric vehicle 90 (step S105). The power distribution between the power server 70 and the electric vehicle 90 can be performed using the function of the power bus system proposed in Japanese Patent Application Laid-Open No. 2008-123051 and the like, in which information and electric power are frequency-divided; however, in the present invention, the power distribution is not limited to such a system, and separate conductors may be used, for example.

When the charging of the electric vehicle 90 is terminated, the power server 70 calculates the amount of electric power actually supplied to the electric vehicle 90 until the termination of the charging and sends the calculated amount to the controller 50 (step S106). The termination of the charging of the electric vehicle 90 includes not only the state that the battery of the electric vehicle 90 is fully charged but also a case in which the charging is artificially terminated. The power server 70 may send both the calculated electric power amount and information of charging start time and charging termination time to the controller 50. Time of day information may also be conveyed, although the controller 50 can determine the time of day based on a received indication that the charging has terminated. The time of day information may be relevant to incentives/penalties for tax calculations based on time of day charging. The power server 70 also delivers to the controller 50 the charging conditions (e.g., voltage, amperage, kW) so the controller can calculate an appropriate tax based on the conditions.

The controller 50 having received the information of the electric power amount from the power server 70 calculates a tax on the charging of the electric vehicle 90 (step S107). The amount of the tax calculated by the controller 50 is sent to the taxation server 100 through the smart meter 10, and the tax is declared or paid. The declaration and payment of tax may be performed at each charging of the electric vehicle 90 or may be performed in a predetermined period unit (for example, on a monthly basis). The taxation timing is determined by law rather than by the charge calculation system 1.

Hereinabove, the operation of the charge calculation system 1 according to an embodiment of the present invention has been described using FIG. 2.

In the above description, there is an unspoken understanding that an average travelling area of the electric vehicle 90 and a taxation area to the electric vehicle 90 are the same.

However, the electricity tax for electric vehicles is not always fixed in a region or a country. Near the border between countries with different tax rates or near a boundary between provinces with different tax rates, there may occur such a case that an electric vehicle is charged in a region with low electricity tax, and the electric vehicle travels mainly in a region with high electricity tax. If this case is allowed, tax is paid only in the region with low electricity tax, and tax is not paid in the region with high electricity tax. However, the system allows for apportionment of state and local based taxation. State, local, and national tax rates are held in the taxation server 100, although these rates may also be held in the controller 50 example or downloaded on the fly from a remote source.

In order to avoid the above situation, the electric vehicle is preferably provided with travelling area recording mechanism (tachograph) that is based on GPS and the like and records a travelling area, or actual travel route. By virtue of the travelling area recording mechanism, logs of an area where the electric vehicle actually travels and the travel distance are obtained, and the contents are recorded in the travelling area recording mechanism. Since the travelling area at the initial charging point is not otherwise specified, it is preferable that the electricity tax in the charging area be imposed.

In fact, when an electric vehicle mounted with the travelling area recording mechanism travels, a taxable travelling route is recorded in the travelling area recording mechanism as provided by a data feed from GPS or the like, and the area where the electric vehicle has actually travelled is determined in the next charging. Thus, the electricity tax on the next charging is determined based on the information of the travelling area recorded in the travelling area recording mechanism. At this time, in the processing for determining the electricity tax, not only simply based on the previous recording, but also weighting storage processing may be used. As for the taxation processing corresponding to the travelling area, it is considered to be determined by law rather than by the charge calculation system 1.

As described above, the area where an electricity tax is to be imposed can be determined, so that the payment recipient of the electricity tax can be determined. The electricity tax may be paid not only to a country, but also to prefectures (states) and municipalities where an electric vehicle has actually travelled.

Figure 3:
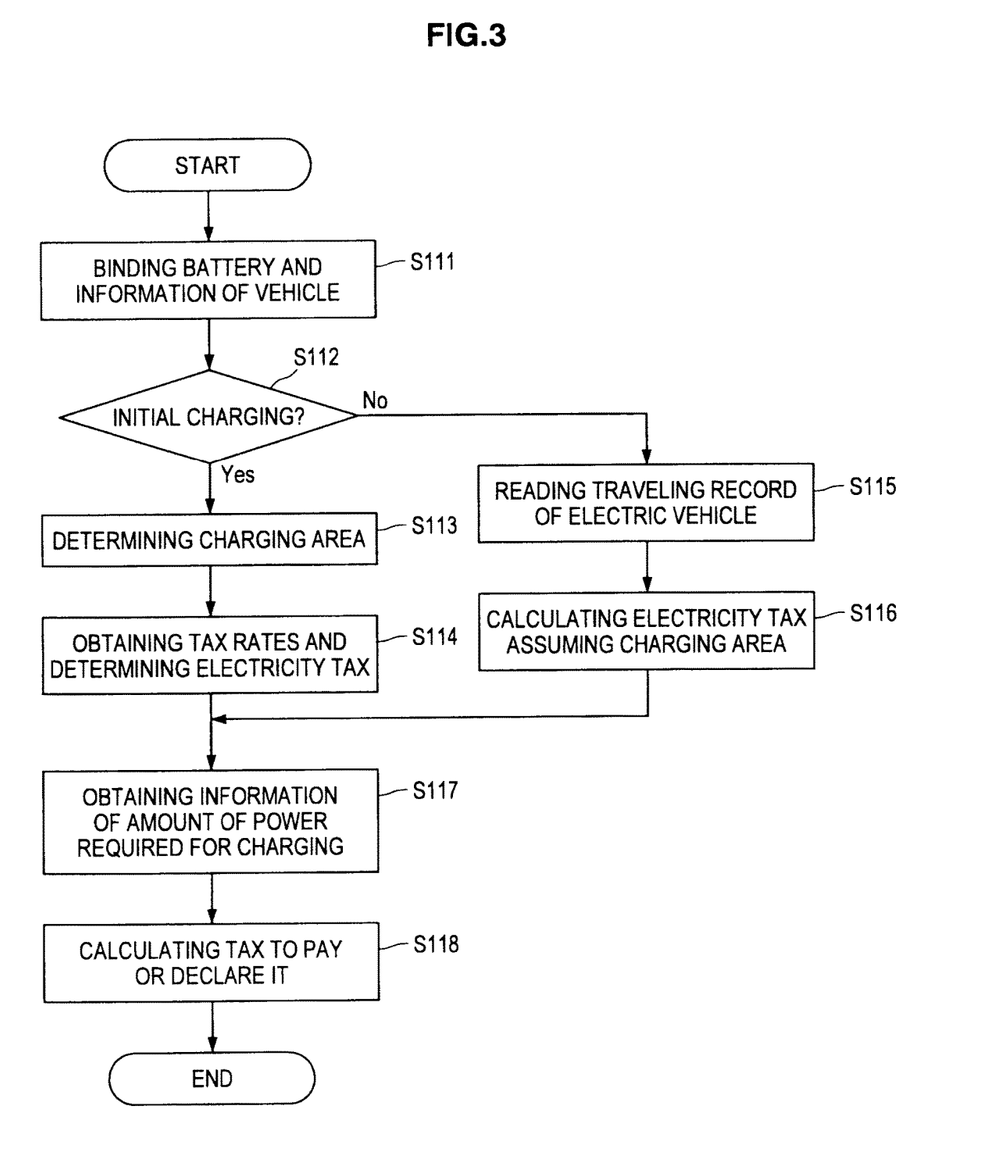
FIG. 3 is a flow chart showing an electricity tax determination processing in a charge calculation system 1 according to the embodiment of the present invention.

Hereinafter, an example of an algorithm determining the electricity tax is shown. FIG. 3 is a flow chart showing an electricity tax determination processing in the charge calculation system 1 according to an embodiment of the present invention. Hereinafter, the electricity tax determination processing in the charge calculation system 1 according to an embodiment of the present invention will be described using FIG. 3.

First, the information of the battery of the electric vehicle 90 and the information of the electric vehicle 90 are bound at the point of manufacturing the electric vehicle 90 or exchanging the battery of the electric vehicle 90 (step S111). When the information of the battery and the information of the vehicle are bound, as the information to be bound, the ID of the battery and the type and unique ID of the electric vehicle are bound, whereby the subsequent charging of the battery is regarded as charging of the vehicle. This ID (vehicle and battery) is optionally stored in tamperproof memory.

Next, when the power server 70 charges the electric vehicle 90, the controller 50 determines whether the electric vehicle 90 is charged for the first time (step S112). When the electric vehicle 90 is charged for the first time, it is difficult to specify the travelling area of the electric vehicle 90 from the travel record. Therefore, the controller 50 confirms area information (a charging area) at a position where there is a battery charger for the electric vehicle 90 (step S113), and the controller 50 obtains the tax rate in the charging area confirmed in step S113 and confirms the electricity tax at the tax rate (step S114).

Meanwhile, when the electric vehicle 90 is charged for the second and subsequent time, the controller 50 reads the travel records of the electric vehicle 90 (step S115). The controller 50 assumes a new charging area where the electric vehicle 90 will travel after charging, using the read travel record and calculates the electricity tax (step S116). In the calculation in the new charging area, when the electric vehicle has traveled countries and regions with different tax rates, the controller 50 may calculate, assuming the charging area corresponding to the ratio of the travel distances of the countries and regions. Then, the controller 50 calculates a tax to be paid based on the tax rate of each location and, if necessary, pays the tax to the country or the region.

When the controller 50 confirms the electricity tax at the initial charging in step S114, or when the controller 50 calculates the electricity tax assuming the new charging area in step S116, the controller 50 obtains the information of the amount of electric power, required for charging of the electric vehicle 90, from the power server 70 (step S117) and calculates the tax corresponding to the amount of electric power required for charging of the electric vehicle 90 to declare or pay the tax (step S118).

The total amount of tax may be calculated by the following formula, for example:

total amount of tax=travel ratio in $A$ area×tax rate of $A$ area×electric power amount+travel ratio in $B$ area×tax rate of $B$ area×electric power amount +. . . .

If a tax is paid for each area, naturally, the amount of tax calculated for each area may be paid to the corresponding area.

The tax amount at charging is based on the previous travel, and therefore, instead of simply using the travel data immediately before charging, each past taxation data is weighted retroactive to the past charging, and the amount of tax at charging may be determined. For example, when the total amount of tax at the present charging is determined from the last total amount of tax and the total amount of tax before the last, the present total amount of tax may be calculated by the following formula:

the present total amount of tax=0.6×the last total amount of tax+0.4×the total amount of tax before the last (this is the same as an algorithm of a general digital low pass filter).

Of course, it is difficult to determine a future travelling area at charging of the electric vehicle, and therefore, regardless of the formula, it is difficult to tax the electric vehicle completely fairly in comparison with the vehicle in the related art powered by an internal combustion engine. However, in the future, it is considered that fairness is secured by a widespread use of electric vehicles. Whether the charging of the electric vehicle is fairly taxed is appropriately scrutinized, and the above formula may be dynamically changed.

As described above, the electricity tax determination processing in the charge calculation system 1 according to an embodiment of the present invention has been described using FIG. 3. In the electricity tax determination processing shown in FIG. 3, when a tax is calculated and declared, a taxpayer ID for use in uniquely specifying a taxpayer is preferably used. Namely, the taxpayer is specified, whereby a company providing a charging station where an electric vehicle is charged may bear a tax as a part of advertising campaigns, for example. Namely, the taxpayer is suitably set in the electricity tax determination processing shown in FIG. 3, whereby, as advertising campaigns, it is possible to prevent from taxing on a user when an electric vehicle of the user is charged (of course, it is preferable that the electricity charge itself be charged to the user).

As described above, the electricity tax can be determined according to the travelling area of the electric vehicle, so that when the electric vehicle travels a particular road such as a bridge and a road, the travel charge can be collected according to the travel. Namely, even if there is no tollbooth as in an expressway, facilities requiring a large construction cost can charge extra. By virtue of the use of the charge calculation system 1, payment of a charge to a country or a region or payment to both a country and a region at a predetermined rate can be realized without increasing office expenses or only by an initial installation cost and a slight maintenance cost of a server and the like.

The above can be processed only by reading such a parameter as the charging area as a suitable facility such as a bridge and a road. Thus, in this case, a plurality of arguments are preferably provided for such a parameter as the charging area. The start and ending of charging for specified road facilities can be dynamically determined by access to a dedicated server (for example, the taxation server 100).

As described above, when the electricity tax is determined by the log of the travelling area, vehicles having no travelling area recording means or having the travelling area recording mechanism and no log of the travelling area may be advantageous in taxation. Thus, as for the vehicle having no log of the travelling area, if the vehicle is an electric vehicle, the electricity tax will be increased, and if the vehicle is an internal combustion engine vehicle, the gasoline tax will be increased. However, this is determined by law rather than by the system.

The charging for travelling specified roads can be applied as it is to an expressway. In this case, not tax but the toll of the expressway will be collected. Technically, an expressway ID specifying an expressway as a mere travelling area and a section ID for use in specifying the travel section of the expressway are just logged in the charge calculation system 1, so that the toll of the expressway can be calculated. Thus, it can contribute to an unmanned operation of an expressway (or the saving of manpower for vehicles having no function of obtaining a log), and, in addition, a gate of a tollbooth is finally removed to relieve unnecessary stress of vehicle's drivers and prevent accidents.

[1-3. Constitution of Controller]

Figure 4:
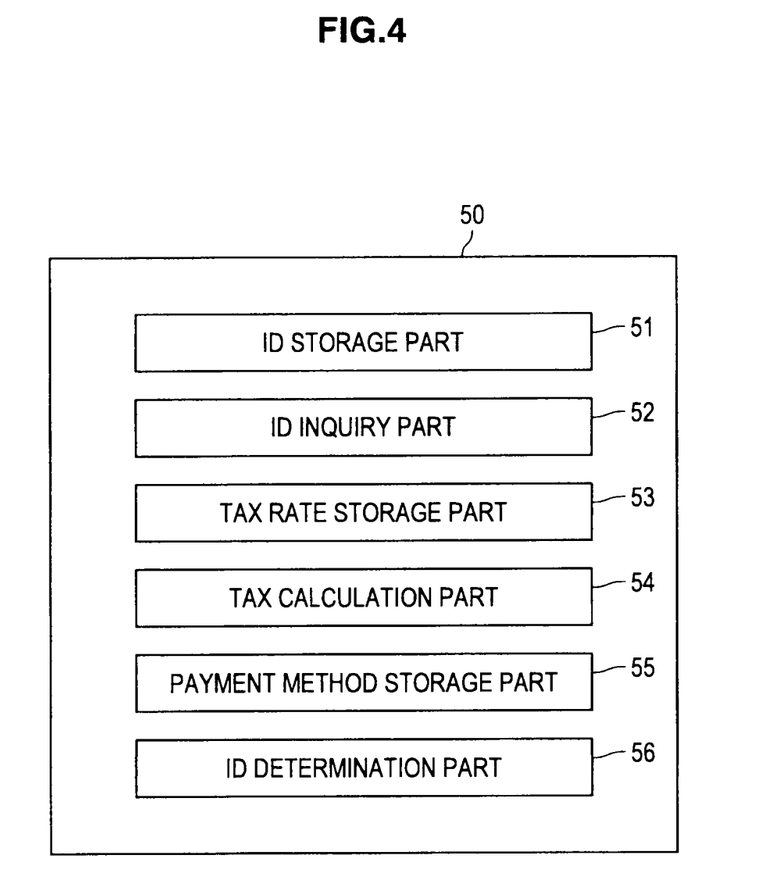
FIG. 4 is an explanatory view showing a constitutional example of a controller 50 according to the embodiment of the present invention.

FIG. 4 is an explanatory view showing a constitutional example of the controller 50 according to an embodiment of the present invention. Hereinafter, the constitutional example of the controller 50 according to the embodiment of the present invention will be described using FIG. 4.

As shown in FIG. 4, the controller 50 according to an embodiment of the present invention is configured to include an ID storage part 51, an ID inquiry part 52, a tax rate storage part 53, a tax calculation part 54, a payment method storage part 55, and an ID determination part 56.

The ID storage part 51 corresponds to the ID storage part that is one of the functions of the controller 50 and stores an ID for use in specifying the electric vehicle 90 as a client. The ID stored in the ID storage part 51 is obtained by downloading from an external server (not shown) through the smart meter 10, for example. The electric vehicle 90 having the ID stored in the ID storage part 51 is allowed to be charged by the power server 70.

In the ID inquiry part 52, when the electric power supply is performed between the power server 70 and the electric vehicle 90, if the power server 70 returns an ID of the unknown electric vehicle 90, the ID inquiry part 52 inquires of an external server (not shown) about the unknown ID through the smart meter 10, internet, and other networks. The ID inquiry part 52 inquires ID, and the information of the ID is downloaded from the external server, whereby the inquiry is completed. When the inquiry is completed, the ID inquiry part 52 stores the ID in the ID storage part 51. According to this constitution, the controller 50 can allow the power supply between the power server 70 and the electric vehicle 90.

The tax rate storage part 53 stores the tax rate of the tax imposed when the electric vehicle 90 is charged. The tax rate stored in the tax rate storage part 53 is preferably lower than the tax rate imposed when electric power other than natural electric power is used as a power source. If necessary, the tax rate may be updated from an external server (not shown) through the smart meter 10, internet, and other networks.

The tax calculation part 54 calculates the tax imposed when the electric vehicle 90 is charged based on the tax rate stored in the tax rate storage part 53. The payment method storage part 55 stores a method for paying the tax calculated by the tax calculation part 54. For example when tax is paid with bill, the payment method storage part 55 stores the name and address on the bill, and when the tax is paid with a credit card, the payment method storage part 55 stores the credit card number.

The ID determination part 56 determines whether the ID sent from the power server 70 is stored in the ID storage part 51. When the ID sent from the power server 70 is not stored in the ID storage part 51, the ID determination part 56 informs the inquiry about the ID to the ID inquiry part 52. When the ID sent from the power server 70 is stored in the ID storage part 51, the ID determination part 56 allows the power server 70 to charge the electric vehicle 90.

In FIG. 4, although the controller 50 includes the tax calculation part 54, the present invention is not limited to this example. When a tax is imposed based on the travelling area of the electric vehicle 90, the controller 50 obtains the information of the travelling area from the electric vehicle 90 to transmit the obtained information of the travelling area to the taxation server 100 through the communication apparatus 40, and the tax may be calculated in the taxation server 100. When a tax is calculated in the taxation server 100, the controller 50 may include means of transmitting the amount of electric power, required for the power server 70 to charge the electric vehicle 90, from the controller 50 to the taxation server 100.

<2. Conclusion>

As described above, according to an embodiment of the present invention, a tax is calculated according to the amount of electric power required for charging of the electric vehicle and the area where the electric vehicle has travelled, and the tax can be imposed on the user of the electric vehicle. When the taxation processing is applied to the charging of the electric vehicle, the fairness of tax burdens between the electric vehicle and vehicles powered by an internal combustion engine can be secured to some extent, and, at the same time, countries and local governments can use the tax generated in the charging of the electric vehicle for road construction.

In the above embodiment of the present invention, the charging of the electric vehicle has been exemplified; however, in the present invention, the object to be charged is not limited to the electric vehicle, and an electric motorcycle or a train may be charged as long as it is a moving vehicle which can travel by a rechargeable battery. The above series of processing may be executed by hardware or software. When the processing is executed by software, a recording medium having stored therein a program may be built in the controller 50 and the like, for example. The program may be read by a CPU (Central Processing Unit), a DSP (Digital Signal Processor), or other controller built in the controller 50 and the like to be sequentially executed.

It should be understood by those skilled in the art that various modifications, combinations, sub-combinations and alterations may occur depending on design requirements and other factors insofar as they are within the scope of the appended claims or the equivalents thereof For example, in the above embodiment, the controller 50 obtains the ID of the electric vehicle 90, and when the ID is registered on the controller 50, the electric vehicle 90 is allowed to be charged by the power server 70; however, the present invention is not limited to this example. For example, the user ID of a user having an electric vehicle is specified by any method, and a tax may be imposed on the user. As a method of specifying the user ID, for example, the user ID previously registered on the electric vehicle 90 may be obtained by the controller 50, or the user inputs the user ID to the controller 50, whereby the user ID may be specified.

Furthermore, for example, the controller 50 obtains the presence or absence of tax payment for the charging of the electric vehicle 90, and if a tax is not paid, the controller 50 does not have to allow the charging from the power server 70. At this time, when the past history is checked to reveal that a tax has been paid for the electric vehicle 90, the electric vehicle 90 may be charged by the power server 70 just one time, collateralizing the tax payment.

The present application contains subject matter related to that disclosed in Japanese Priority Patent Application JP 2009-293022 filed in the Japan Patent Office on Dec. 24, 2009, the entire content of which is hereby incorporated by reference.

What is claimed is:

1. An electric charging controller comprising: circuitry configured to store, in a memory of the electric charging controller, a plurality of IDs of a plurality of electric vehicles, each ID of the plurality of IDs uniquely identifying each electric vehicle of the plurality of electric vehicles, receive a request for charging from an electric vehicle of the plurality of electric vehicles, receive, from an electric memory of the electric vehicle, at least a registration location of the electric vehicle and the ID of the electric vehicle, determine whether the received ID of the electric vehicle is stored in the memory of the electric charging controller, control charging of the electric vehicle from a power server that receives power from a non-power-grid source in a format compatible with the electric vehicle based on the received ID of the electric vehicle in a case it is determined that the received ID of the electric vehicle is stored in the memory of the electric charging controller, the non-power grid source being configured to transmit electric power independently from a power grid source, and calculate an amount of tax to be applied for an amount of electricity used from both the power grid and the non-power-grid source in charging of the external vehicle based on the registration location of the electric vehicle.

2. The controller of claim 1, wherein:
said circuitry associates said calculated amount of tax to the electric vehicle.

3. The controller of claim 2, wherein said circuitry calculates said amount of tax by including at least one of a state tax rate and a local tax rate according to the registration location.

4. The controller of claim 3, wherein:
the circuitry receives a recorded driving history of said electric vehicle, and said processor the circuitry calculates an apportionment of said amount of tax according to different taxing jurisdictions included in said recorded driving history.

5. The controller of claim 1, wherein said circuitry calculates said amount of tax by including in the calculation at least one of a charging time, and a battery model.

6. The controller of claim 1, wherein said circuitry applies a tax credit as part of calculating said amount of tax, said tax credit corresponding to an incentive offered by a taxing authority.

7. The controller of claim 6, wherein said incentives include incentives for using power supplied from a private electric power source, the private electric power source being an organic source disconnected from an existing commercial power grid.

8. A method for charging of an electric vehicle, comprising:

storing, in a memory, a plurality of IDs of a plurality of electric vehicles, each ID of the plurality of IDs uniquely identifying each electric vehicle of the plurality of electric vehicles;

receiving, at circuitry, data requesting an electric charge for the electric vehicle of the plurality of electric vehicles;

receiving, from an electric memory of the electric vehicle, a registration location of the electric vehicle and the ID of the electric vehicle;

determining whether the received ID of the electric vehicle is stored in the memory;

controlling, with the circuitry, charging of the electric vehicle from a power server that receives power from a non-power-grid source in a format compatible with the electric vehicle based on the received ID of the electric vehicle in a case it is determined that the received ID of the electric vehicle is stored in the memory of the electric charging controller, the non-power grid source being configured to transmit electric power independently from a power grid source; and calculating, with the circuitry, an amount of tax for the amount of electricity used to charge the electric vehicle from both the power grid and the non-power-grid source, wherein said calculating includes calculating said amount of tax based on the registration location of the electric vehicle.

9. The method of claim 8, wherein:
said calculating includes associating the calculated amount of tax to the electric vehicle.

10. The method of claim 9, wherein
said calculating includes calculating said amount of tax by including at least one of a state tax rate and a local tax rate according to the registration location.

11. The method of claim 10, wherein:
said calculating includes calculating an apportionment of said amount of tax according to different taxing jurisdictions included in a recorded driving history.

12. The method of claim 9, wherein an amount of electricity requested is determined after said amount of electricity has been delivered to said electric vehicle.

13. The method of claim 9, wherein said calculating includes calculating said amount of tax by including in the calculation at least one of a charging time, and a battery model.

14. The method of claim 9, wherein said calculating includes applying a tax credit as part of calculating said amount tax, said tax credit corresponding to an incentive offered by a taxing authority.

15. The method of claim 9, wherein said incentives include incentives for using power supplied from a private electric power source, the private electric power source being an organic source disconnected from an existing commercial power grid.

16. The controller of claim 4, wherein:
the recorded driving history indicates one or more roads on which the electric vehicle has driven, and
the circuitry calculates the amount of tax based on the one or more roads indicated in the recorded driving history.

17. The controller of claim 16, wherein
the recorded driving history further indicates one or more toll roads on which the electric vehicle has driven, and
the circuitry calculates, in addition to the amount of tax, a travel charge based on the one or more toll roads indicated in the recorded driving history.

18. The method of claim 11, wherein:
the recorded driving history indicates one or more roads on which the electric vehicle has driven, and
the calculating includes calculating the amount of tax based on the one or more roads indicated in the recorded driving history.

19. The method of claim 18, wherein
the recorded driving history further indicates one or more toll roads on which the electric vehicle has driven, and
the calculating includes, in addition to calculating the amount of tax, calculating a travel charge based on the one or more toll roads indicated in the recorded driving history.

20. The controller of claim 1, wherein
the registration location identifies a location where the external device is registered for tax purposes.

21. The controller of claim 4, wherein:
said circuitry determines, based on the recorded driving history, a new charging area where said electric vehicle will travel following charging, and
said circuitry calculates the apportionment of said amount of tax according to different taxing jurisdictions included in said new charging area and said recorded driving history.

22. The electric charging controller of claim 1, wherein the electric memory is tamperproof.

23. The controller of claim 1, wherein
the circuitry is configured to refer to an external server the ID of the electric vehicle in a case it is determined that the received ID of the electric vehicle is not stored in the memory of the electric charging controller.

\* \* \* \* \*